United States Patent [19]
Czubatyj et al.

[11] Patent Number: 5,825,046
[45] Date of Patent: Oct. 20, 1998

[54] COMPOSITE MEMORY MATERIAL COMPRISING A MIXTURE OF PHASE-CHANGE MEMORY MATERIAL AND DIELECTRIC MATERIAL

[75] Inventors: Wolodymyr Czubatyj, Warren; Stanford R. Ovshinsky, Bloomfield Hills; David A. Strand, Bloomfield Township; Patrick Klersy, Lake Orion; Sergey Kostylev, Bloomfield Hills; Boil Pashmakov, Troy, all of Mich.

[73] Assignee: Energy Conversion Devices, Inc., Troy, Mich.

[21] Appl. No.: 739,080

[22] Filed: Oct. 28, 1996

[51] Int. Cl.[6] .................................................. H01L 47/00
[52] U.S. Cl. ...................... 257/2; 257/4; 257/5; 257/77; 365/163
[58] Field of Search ................................. 257/2, 4, 5, 77; 365/163

[56] References Cited

U.S. PATENT DOCUMENTS

| | | | |
|---|---|---|---|
| 3,271,591 | 9/1966 | Ovshinsky | 307/88.5 |
| 3,483,110 | 12/1969 | Rozgonyi | 204/192 |
| 3,530,441 | 9/1970 | Ovshinsky | 340/173 |
| 3,810,128 | 5/1974 | Moser | 340/173 R |
| 5,154,957 | 10/1992 | Yamada et al. | 428/64 |
| 5,255,260 | 10/1993 | Yamada et al. | 369/199 |

*Primary Examiner*—Sara W. Crane
*Attorney, Agent, or Firm*—Marvin S. Siskind; David W. Schumaker

[57] ABSTRACT

A composite memory material comprising a mixture of active phase-change memory material and inactive dielectric material. The phase-change material includes one or more elements selected from the group consisting of Te, Se, Ge, Sb, Bi, Pb, Sn, As, S, Si, P, O and mixtures or alloys thereof. A single cell memory element comprising the aforementioned composite memory material, and a pair of spacedly disposed contacts.

14 Claims, 3 Drawing Sheets

FIG - 4

COMPOSITE MEMORY MATERIAL COMPRISING A MIXTURE OF PHASE-CHANGE MEMORY MATERIAL AND DIELECTRIC MATERIAL

FIELD OF THE INVENTION

The present invention relates generally to electrically operated memory material. More specifically, the present invention relates to a composite memory material comprising a mixture of active phase-change memory material and inactive dielectric material.

BACKGROUND AND PRIOR ART

The Ovonic EEPROM is a novel, proprietary, high performance, non-volatile, thin-film electronic memory device. Its advantages include non-volatile storage of data, potential for high bit density and, consequently, low cost because of its small footprint and simple two-terminal device configuration, long reprogramming cycle life, low programming energies and high speed. The Ovonic EEPROM is capable of both analog and digital forms of information storage. Digital storage can be either binary (one bit per memory cell) or multi-state (multiple bits per cell). Only minor modifications are necessary to switch between the two digital modes. For purposes of the instant invention, the terms "memory elements" and "control elements" will be employed synonymously.

EARLY ELECTRICAL PHASE CHANGE MEMORY

The general concept of utilizing electrically writable and erasable phase change materials (i.e., materials which can be electrically switched between generally amorphous and generally crystalline states) for electronic memory applications is well known in the art, as is disclosed, for example, in U.S. Pat. No. 3,271,591 to Ovshinsky, issued Sep. 6, 1966 and in U.S. Pat. No. 3,530,441 to Ovshinsky, issued Sep. 22, 1970, both of which are assigned to the same assignee as the present invention, and both disclosures of which are incorporated herein by reference (hereinafter the "Ovshinsky patents").

As disclosed in the Ovshinsky patents, such phase change materials can be electrically switched between structural states of generally amorphous and generally crystalline local order or between different detectable states of local order across the entire spectrum between completely amorphous and completely crystalline states. That is, the Ovshinsky patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the Ovshinsky patents could also, if required, be switched between just the two structural states of generally amorphous and generally crystalline local order to accommodate the storage and retrieval of single bits of encoded binary information.

The electrically erasable phase change memories described in the Ovshinsky patents, as well as subsequent electrical solid state memory, had a number of limitations that prevented their widespread use as a direct and universal replacement for present computer memory applications, such as tape, floppy disks, magnetic or optical hard disk drives, solid state disk flash, DRAM, SRAM, and socket flash memory. Specifically, the following represent the most significant of these limitations: (i) a relatively slow (by present standards) electrical switching speed, particularly when switched in the direction of greater local order (in the direction of increasing crystallization); (ii) a relatively high input energy requirement necessary to initiate a detectable change in local order; and (iii) a relatively high cost per megabyte of stored information (particularly in comparison to present hard disk drive media).

The most significant of these limitations is the relatively high energy input required to obtain detectable changes in the chemical and/or electronic bonding configurations of the chalcogenide material in order to initiate a detectable change in local order. Also significant were the switching times of the electrical memory materials described in the Ovshinsky patents. These materials typically required times in the range of a few milliseconds for the set time (the time required to switch the material from the amorphous to the crystalline state); and approximately a microsecond for the reset time (the time required to switch the material from the crystalline back to the amorphous state). The electrical energy required to switch these materials typically measured in the range of about a microjoule.

It should be noted that this amount of energy must be delivered to each of the memory elements in the solid state matrix of rows and columns of memory cells. Such high energy levels translate into high current carrying requirements for the address lines and for the cell isolation/address device associated with each discrete memory element. Taking into consideration these energy requirements, the choices of memory cell isolation elements for one skilled in the art would be limited to very large single crystal diode or transistor isolation devices, which would make the use of micron scale lithography and hence a high packing density of memory elements impossible. Thus, the low bit densities of matrix arrays made from this material would result in a high cost per megabyte of stored information.

By effectively narrowing the distinction in price and performance between archival, non-volatile mass memory and fast, volatile system memory, the memory elements of the present invention have the capability of allowing for the creation of a novel, non-hierarchal "universal memory system". Essentially all of the memory in the system can be low cost, archival and fast. As compared to original Ovshinsky-type phase change electrical memories, the memory materials described herein provide over six orders of magnitude faster programming time (less than 30 nanoseconds) and use extremely low programming energy (less than 0.1 to 2 nanojoules) with demonstrated long term stability and cyclability (in excess of 10 trillion cycles). Also, experimental results indicate that additional reductions in element size can increase switching speeds and cycle life.

In general, development and optimization of the class of chalcogenide memory materials has not proceeded at the same rate as other types of solid state electrical memories that now have substantially faster switching times and substantially lower set and reset energies. These other forms of memories typically employ one or two solid state microelectronic circuit elements for each memory bit (as many as three or four transistors per bit) in some memory applications. The primary "non-volatile" memory elements in such solid state memories, such as EEPROM, are typically floating gate field effect transistor devices which have limited re-programmability and which hold a charge on the gate of a field effect transistor to store each memory bit. Since this charge can leak off with the passage of time, the storage of information is not truly non-volatile as it is in the phase change media of the prior art where information is stored through changes in the actual atomic configuration or electronic structure of the chalcogenide material from which the elements are fabricated. These other forms of memories now enjoy acceptance in the marketplace.

In contrast to DRAM and SRAM, volatile memory devices, and other "flash" devices such as floating gate structures, no field effect transistor devices are required in the electrical memory devices of the present invention. In fact, the electrically erasable, directly overwritable memory elements of the present invention represent the simplest electrical memory device to fabricate, comprising only two electrical contacts to a monolithic body of thin film chalcogenide material and a semiconductor diode for isolation. As a result, very little chip "real estate" is required to store a bit of information, thereby providing for inherently high density memory chips. Furthermore, additional increases in information density can be accomplished through the use of multibit storage in each discrete memory cell.

In order to address the flash EEPROM market and be considered as a universal memory, memory elements must be truly non-volatile. This is even more significant if the memory element is claimed to possess multibit storage capabilities. If a set resistance value is lost or even found to significantly drift over time, the information stored therein is destroyed, users lose confidence in the archival capabilities of the memory.

In addition to set resistance stability, another highly important factor which would be required of a universal memory is low switching current. This is extremely significant when the EEPROMs are used for large scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the comparatively large power consumption of the mechanical systems. In the case of lap-top computers, this is of particular interest because the mechanical hard disk drive is one of the largest power consumers therein. Therefore, it would be especially advantageous to reduce this power load, thereby substantially increasing the usage time of the computer per charge of the power cells. However, if the EEPROM replacement for mechanical hard drives has high switching energy requirements (and therefore high power requirements), the power savings may be inconsequential or at best unsubstantial. Therefore, any EEPROM which is to be considered a universal memory requires low switching energy.

Yet another requirement of a EEPROM universal memory is high thermal stability of the information stored therein. Today's computers, especially personal computers, are routinely subjected to high temperatures. These high temperatures can be caused by internally created heat such as from power sources or other heat producing internal components. These high temperatures may also be caused by environmental factors, such as use of the computer in a hot climate or storage of the computer in an environment which is directly or indirectly heated to higher than normal temperatures. Whatever the cause of the elevated temperatures, present computer memory systems, especially "hard" or archival memory, must be thermally stable even at relatively high temperatures. Without this thermal stability data loss may occur leading to the aforementioned loss of credibility.

Still another requirement of a EEPROM universal memory is long write/erase cycle life. For EEPROMs, as is the case with all archival memory, cycle life plays an important role in consumer confidence and acceptance. If the cycle life of a memory device is too short, the consumer will be adverse to using this device for fear of losing valuable data. If the EEPROM is to be used as a replacement for computers main memory or display memory, that is, as a replacement for DRAM, SRAM or VRAM, the requirement of long cycle life is even more critical. The main and display memory are a computer's most often written to/erased data storage area. Every time a new computer program is loaded, a portion of the computer's main memory is erased and rewritten. During the execution of a computer program, a portion of the computer's main memory is constantly being cycled. Every time the computer monitor's display is changed, portions of the display memory are cycled. If the EEPROMs used to replace the computer's main and display memory do not have a relatively long write/erase cycle life, these memories would need to be replaced excessively.

SUMMARY OF THE INVENTION

An object of the present invention is to provide a solid state memory material having reduced switching current requirements and greater thermal stability of stored data therein. It is also an object of the present invention to provide a memory element comprising the aforementioned memory material.

These and other objects of the present invention are accomplished by a composite memory material comprising: a mixture of active phase-change memory material and inactive dielectric material. The phase-change memory material includes one or more elements selected from the group consisting of Te, Se, Ge, Sb, Bi, Pb, Sn, As, S, Si, P, O and mixtures or alloys thereof.

These and other objects are also accomplished by a single cell memory element comprising: a volume of memory material defining a single cell memory element, the memory material comprising a mixture of active phase-change material and inactive dielectric material; and a pair of spacedly disposed contacts, the contacts providing terminals for reading information stored in and writing information to the memory element.

There and other objects are also accomplished by an electrically operated, directly overwritable, multibit, single cell memory element comprising: a volume of memory material defining a single cell memory element, the memory material constituting means for assuming a large dynamic range of electrical resistance values with the ability to be set directly to one of a plurality of resistance values within the dynamic range without the need to be set to a specific starting or erased resistance value, regardless of the previous resistance value of the material in response to a selected electrical input signal so as to provide the single cell with multibit storage capabilities; and a pair of spacedly disposed contacts for supplying the electrical input signal to set the memory material to a selected resistance value within the dynamic range, wherein at least one of the spacedly disposed contacts is a mixture of a first contact material and a second contact material, wherein the first contact material includes carbon, and wherein the second contact material includes at least one transition metal element. Preferably, the second contact material includes one or more elements selected from the group consisting of Ti, V, Cr, Zr, Nb, Mo, Hf, Ta, W and mixtures or alloys thereof. More preferably, the second contact material includes Ti and W.

DETAILED DESCRIPTION OF THE INVENTION

Disclosed herein is a composite memory material comprising a mixture of phase-change memory material and inactive dielectric material. The composite memory material of the present invention provides for switching within a wide dynamic range of stable states with low energy inputs at fast speeds so that it can be used to fabricate improved electrical memory elements.

The composite memory material is non-volatile and will maintain the integrity of stored information (within a selected margin of error) without the need for periodic refresh signals. The composite memory material can also be directly overwritable so that the discrete memory elements need not be erased (set to a specified starting point) in order to change the information stored there. The fast and low energy switching to any of the different values of resistance can be attributed to the fact that the switching occurs without the need for gross atomic rearrangement of the phase-change switching material.

As stated, the composite memory material is a mixture of active phase-change memory material and inactive dielectric material. The active phase-change memory material is formed from a plurality of constituent atomic elements. The phase-change memory material includes one or more elements selected from the group consisting of Te, Se, Ge, Sb, Bi, Pb, Sn, As, S, Si, P, O and mixtures or alloys thereof. The phase-change memory material preferably includes at least one chalcogen element and may include at least one transition metal element.

Preferably, the chalcogen element is selected from the group consisting of Te, Se and mixtures or alloys thereof. More preferably, the chalcogen element is a mixture of Te and Se.

The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se.

Specifically, the tellurium alloys described herein have a valence band made up of lone pair states. Since four (4) p shell electrons are present in Te, and the Te atom is chemically bonded by two of these bonding electrons in the p shell, the other two outer electrons (the lone pair) are not utilized for bonding purposes and hence do not substantially change the atomic energy of the system. In this regard, note that the highest filled molecular orbital is the orbital which contains the lone pair electrons. This is significant because, in a perfect stoichiometric crystal of tellurium and germanium atoms, upon the application of some internal strain in the lattice from which the crystallite is formed, the valence band can broaden and move upward toward the position of the then existing Fermi level. However, TeGe crystals are naturally "self-compensated", that is, the crystal desires to preferentially assume a Te rich (approximately 52 percent Te and 48 percent Ge) composition. The stoichiometric crystal is a face centered cube; however, with the addition of a minimal amount of energy, the crystal can assume a rhombohedral lattice structure by increasing the number of its Ge and/or Sb vacancies. It is this creation of vacancies in the crystalline lattice structure, which can reduce lattice strain in TeGe alloys, is responsible for lowering the energy state of the material and moves the Fermi level toward the valence band.

It is acceptable, if not essential to superimpose an amorphous model of local order on top of a short range local order model for the purpose of obtaining a descriptive, if not perfectly predictive explanation of atomic behavior. When considering the amorphous nature of the material, note that the density of defect states in the band tails is greatest adjacent the band edges, while the depth of the recombination centers for captured charge carriers are deeper farther away from the band edges. The presence of these deep traps and tail states would provide a possible explanation for intermediate stable resistance values between the Fermi level position and the band edge. Regardless of theory, when fully crystalline, the semiconductor material of the instant invention is a degenerate semiconductor which exhibits metallic-like conduction.

It is further believed that the size of the crystallites which exist in the bulk of the semiconductor and memory material is relatively small, preferably less than about 2000 Å, more preferably between about 50 Å and 500 Å, and most preferably on the order of about 200 Å to about 400 Å. Further, these crystallites are believed to be surrounded by an amorphous skin which may contribute to the rapid formation of the many Fermi level positions of the material, detectable as different resistances (conductivities), as well as to the lower energy requirements for the transitions between these detectable resistance values to which the material can be reliably and repeatably set.

It has also been found that modulation of the switching characteristics of two or three terminal semiconductor devices fabricated from the microcrystalline materials of the present invention may be controlled such that repeatable and detectable resistance values can be effected. It has been found that, in order for the materials of the present invention to be quickly set by low energy input signals to a desired conductivity (determined by the Fermi level position), it is only necessary that said materials are capable of stable (or long lived metastable) existence within at least two different Fermi level positions, which Fermi level positions are characterized by substantially constant band gaps but different electrical conductivities. As noted above, it is also believed that the relatively small crystallite size may contribute to the rapid transition between detectable values of resistance.

One characteristic of the semiconductor materials of the present invention is their tendency toward the formation of more and smaller crystallites per unit volume. Crystallite sizes of the widest preferential range of representative materials embodying the present invention have been found to be far less than about 2000 Å, and generally less than the range of about 2,000 Å to 5,000 Å which was characteristic of prior art materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. In one composition that provides substantially improved electrical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. The percentages given are atomic percentages which total 100% of the atoms of the constituent elements. Thus, this composition may be characterized as $Te_aGe_bSb_{100-(a+b)}$. These ternary Te—Ge—Sb alloys are useful starting materials for the development of additional phase-change memory materials having even better electrical characteristics.

The phase-change memory material preferably includes at least one chalcogen and can include one or more transition metals. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se. Generally the elementally modified phase-change materials fall into two categories.

The first category is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. The transition metal preferably include Cr, Fe, Ni, Nb, Pd, Pt and mixtures or alloys thereof.

Specific examples of phase-change memory materials encompassed by this system would include $(Te_{56}Ge_{22}Sb_{22})_{95}Ni_5$, $(Te_{56}Ge_{22}Sb_{22})_{90}Ni_{10}$, $(Te_{56}Ge_{22}Sb_{22})_{95}Cr_5$, $(Te_{56}Ge_{22}Sb_{22})_{90}Cr_{10}$, $(Te_{56}Ge_{22}Sb_{22})_{95}Fe_5$, $(Te_{56}Ge_{22}Sb_{22})_{90}Fe_{10}$, $(Te_{56}Ge_{22}Sb_{22})_{95}Pd_5$, $(Te_{56}Ge_{22}Sb_{22})_{90}Pd_{10}$, $(Te_{56}Ge_{22}Sb_{22})_{95}Pt_5$, $(Te_{56}Ge_{22}Sb_{22})_{95}Pt_{10}$, $(Te_{56}Ge_{22}Sb_{22})_{95}Nb_5$, $(Te_{56}Ge_{22}Sb_{22})_{90}Nb_{10}$, $(Te_{56}Ge_{22}Sb_{22})_{90}Ni_5Cr_5$, $(Te_{56}Ge_{22}Sb_{22})_{90}Ni_5Fe_5$, $(Te_{56}Ge_{22}Sb_{22})_{90}Cr_5Fe_5$, $(Te_{56}Ge_{22}Sb_{22})_{90}Pd_5Cr_5$, $(Te_{56}Ge_{22}Sb_{22})_{90}Ni_5Pd_5$, $(Te_{56}Ge_{22}Sb_{22})_{90}Pd_5Pt_5$, etc.

The second category is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. The transition metal can preferably include Cr, Fe, Ni, Pd, Pt, Nb and mixtures or alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{10}Se_{10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{90}Pd_5Se_5$, $(Te_{56}Ge_{22}Sb_{22})_{80}Pd_{10}Se_{10}$, $(Te_{56}Ge_{22}Sb_{22})_{90}Pt_5Se_5$, $(Te_{56}Ge_{22}Sb_{22})_{80}Pt_{10}Se_{10}$, $(Te_{56}Ge_{22}Sb_{22})_{90}Nb_5Se_5$, $(Te_{56}Ge_{22}Sb_{22})_{80}Nb_{10}Se_{10}$, $(Te_{56}Ge_{22}Sb_{22})_{80}Ni_5Fe_5Se_{10}$, $(Te_{56}Ge_{22}Sb_{22})_{85}Cr_5Fe_5Se_5$, $(Te_{56}Ge_{22}Sb_{22})_{85}Ni_5Pd_5Se_5$, $(Te_{56}Ge_{22}Sb_{22})_{80}Ni_5Pt_5Se_{10}$, $(Te_{56}Ge_{22}Sb_{22})_{85}Ni_5Nb_5Se_5$, $(Te_{56}Ge_{22}Sb_{22})_{85}Pd_5Cr_5Se_5$, $(Te_{56}Ge_{22}Sb_{22})_{80}Pd_5Pt_5Se_{10}$, $(Te_{56}Ge_{22}Sb_{22})_{85}Pd_5Nb_5Se_5$, $(Te_{56}Ge_{22}Sb_{22})_{85}Pt_5Nb_5Se_5$, etc.

The phase-change memory material possesses substantially non-volatile set resistance values. However, if the resistance value of the phase-change material does drift from its original set value, "compositional modification", described hereinafter, may be used to compensate for this drift. As used herein, the term "non-volatile" refers to the condition in which the set resistance value remains substantially constant for archival time periods. Of course, software (including the feedback system discussed hereinafter) can be employed to insure that absolutely no "drift" occurs outside of a selected margin of error. Because drift of the resistance value of the memory elements can, if left unimpeded, hinder gray scale storage of information, it is desirable to minimize drift.

"Compositional modification" is defined herein to include any means of compositionally modifying the phase-change memory material to yield substantially stable values of resistance, including the addition of band gap widening elements to increase the inherent resistance of the material. One example of compositional modification is to include graded compositional inhomogeneities with respect to thickness. For instances, the volume of phase-change memory material may be graded from a first Te—Ge—Sb alloy to a second Te—Ge—Sb alloy of differing composition. The compositional grading may take any form which reduces set resistance value drift. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of phase-change memory material. That is, the volume of phase-change memory material may be formed of a plurality of discrete, relatively thin layers of differing composition. For example, the volume of phase-change memory material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of phase-change memory material which employ this combination are: (1) a volume of phase-change memory material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of phase-change memory material which includes a discrete layer of $Ge_{14}Sb_{29}Te_{57}$ and a graded composition of $Ge_{14}Sb_{29}Te_{57}$ and $Ge_{22}Sb_{22}Te_{56}$.

The composite memory material is a mixture of an active phase-change memory material, such as those described above, and an inactive dielectric material. Generally, the dielectric material can be any dielectric material that is chemically non-reactive with the phase-change memory material. Preferably, the dielectric material has a melting point higher than that of the phase-change memory material.

In particular, the dielectric material may be one or more materials selected from the group consisting of oxides, nitrides, fluorides, sulfides, chlorides, carbides, oxynitrides, carboxynitrides, borides, phosphides and mixtures or alloys thereof. Other dielectric materials known in the art may also be used. The dielectric material may also be chosen from the group of organic dielectric materials. These include, but are not limited to, materials such as amides, polyamides, imides, polyimides, and parylens.

Oxides include silicon oxides such as $SiO_2$, titanium oxides such as $TiO_2$, aluminum oxides such as $Al_2O_3$, zirconium oxides such as $ZrO_2$, germanium oxides such as $GeO_2$, and tatalum oxides such as $Ta_2O_5$. Other possible oxides include $B_2O_3$, $Sb_2O_3$, and PbO. Nitrides include silicon nitrides such as $Si_3N_4$, aluminum nitrides such as AlN, as well as TiN, SiN, ZrN and BN, and off-stoichiometry silicon nitride $SiN_x$. Sulfides include silicon sulfide such as $SiS_2$, germanium sulfide such as $GeS_2$, and zinc sulide such as ZnS. Florides include $MgF_2$, $CaF_2$, and $LiF_2$.

Various glasses may also be used. For instance, LaSiON material containing La, Si, O and N; SiAlON material containing Si, Al, O and N; SiAlON material containing yttrium; or NdSiON material containing Nd, Si, O and N may be used.

The composite memory material is preferably a heterogeneous mixture of active phase-change memory material and inactive dielectric material. One embodiment of such a heterogeneous mixture is that of a multi-layered structure with layers of phase-change memory material intermixed with layers of dielectric material. Preferably, the thickness of each layer may be between about 5 Å to about 75 Å. More preferably, the thickness of each layer may be between about 10 Å to about 50 Å. Most preferably, the thickness of each layer may be between about 20 Å to about 30 Å.

The composite memory material may be made by methods such as sputtering, evaporation or by chemical vapor deposition (CVD), which may be enhanced by plasma techniques such as RF glow discharge. The composite memory material of the instant invention is most preferably made by RF sputtering or evaporation. It may be formed by multiple source sputtering techniques making use of a plurality of targets, usually a target of the phase-change memory material and a target of the dielectric material. With these targets arranged in opposition to a substrate, sputtering is carried out while the substrate is rotated relative to each target. A target containing both phase change and dielectric materials may be used as well. As well, substrate heating may be used to control the morphology of the phase-change material within the composite memory material formed by affecting crystal growth as well as crystal aggregation via surface mobility.

The percentage by volume of dielectric material within the composite memory material can be controlled. Preferably, the percentage by volume of dielectric material is between about 10% and about 90%. More preferably, the percentage by volume of dielectric material is between about 20% and about 80%. Most preferably, the percentage by volume of dielectric material is between about 40% and about 60%.

The composite memory material may also be formed by a spin coating process. The phase-change memory material may be mixed with a dielectric such as an organic polymer like polyamide. The resulting mixture may then be spin coated onto a silicon substrate forming a composite memory material with the desired properties.

Figure 1:
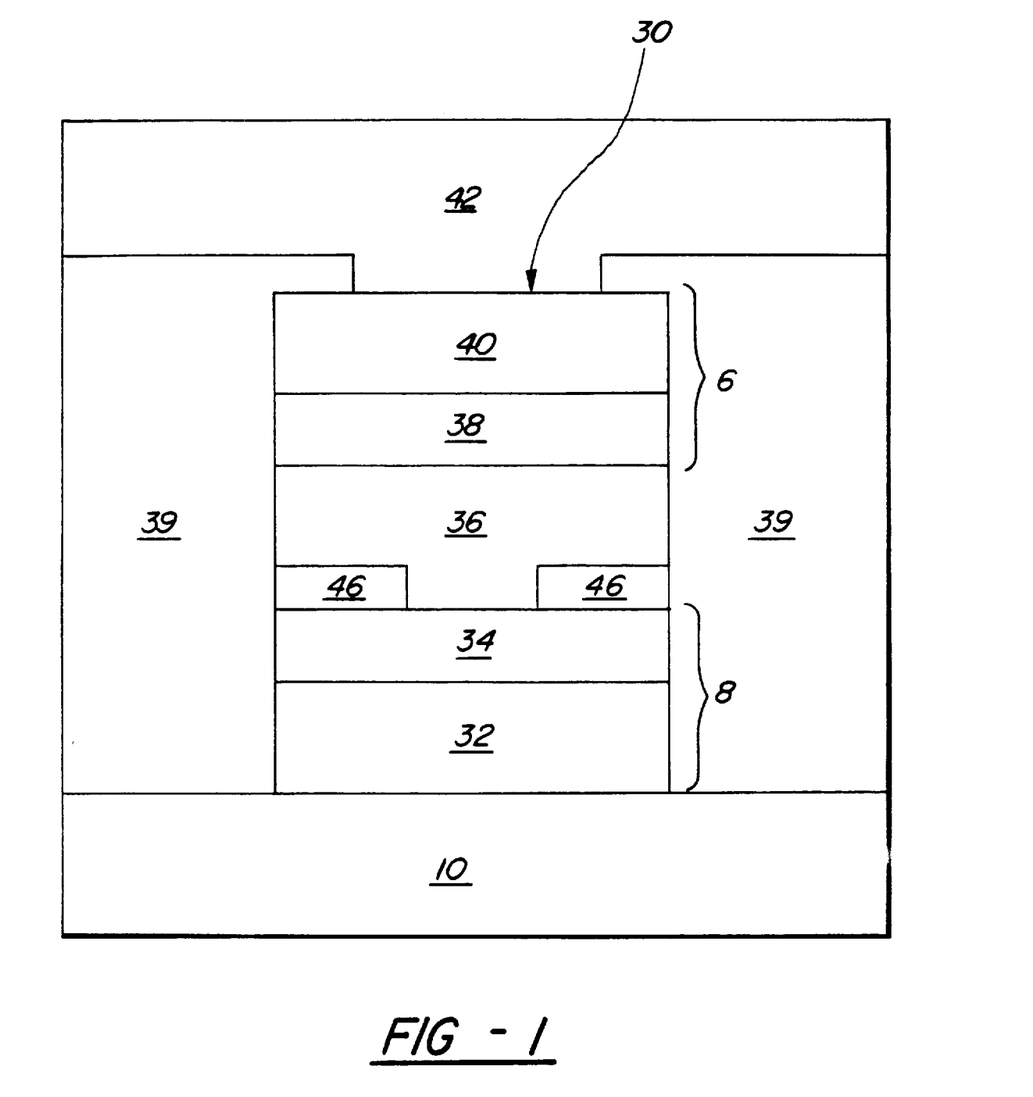
FIG. 1 is a cross-sectional view of a single memory element depicting the composite memory material and pair of contacts.

Also disclosed herein is a single cell memory element comprising the composite memory material disclosed above. The memory element further comprises a pair of spacedly disposed contacts for supplying the electrical input signal to the composite memory material. FIG. 1 shows a cross-sectional view of an embodiment of the memory element formed on a single crystal silicon semiconductor wafer 10. The memory element includes the composite memory material 36, a first spacedly disposed contact 6, and a second spacedly disposed contact 8.

First contact 6 and second contact 8 may each be comprised of two thin-film layers. Thin-film layers 38 and 34, deposited adjacent to the composite memory material 36 have excellent diffusion barrier properties which inhibit the diffusion and electromigration of foreign material into the composite memory material 36.

The adjacent thin-film layers 38, 34 may be comprised of a carbon material such as amorphous carbon. Alternately, the adjacent thin-film layers 38, 34 may be formed from a compound which includes one element selected from the group consisting of Ti, V, Cr, Zr, Nb, M, Hf, Ta, W, and one or more elements selected from the group consisting of B, C, N, Al, Si, P, S. Preferably, the adjacent thin-film layers 38, 34 are formed from a compound which includes Ti and one or more elements selected from the group consisting of C, N, Al, Si and mixtures or alloys thereof. In one embodiment, the adjacent thin-film layers are comprised of a compound having a composition of, in atomic percent, between about 10% to 60% titanium, 5% to 50% carbon and 10% to 60% nitrogen. In addition, the titanium carbonitride may also include up to 40% hydrogen.

In another embodiment, the adjacent thin-film layers 38, 34 are comprised of titanium siliconitride. Preferably, in this embodiment, the adjacent thin-film layers are comprised of a compound having a composition of, in atomic percent, between about 10% to 60% titanium, 5% to 50% silicon and 10% to 60% nitrogen. In addition, the titanium siliconitride may also include up to 40% hydrogen.

In a third embodiment, the adjacent thin-film layers 38, 34 are comprised of titanium aluminum nitride. Preferably, in this embodiment, the adjacent thin-film layers are comprised of a compound having a composition of, in atomic percent, between about 10% to 60% titanium, 5% to 50% aluminum and 10% to 60% nitrogen. In addition, the titanium aluminum nitride may also include up to 40% hydrogen.

The titanium carbonitride, titanium siliconitride and titanium aluminum nitride have excellent barrier properties, preventing both the diffusion and electromigration of foreign material into the composite memory material. Furthermore, the titanium carbonitride, titanium siliconitride and titanium aluminum nitride may be deposited by such methods as physical vapor deposition including evaporation, ion plating as well as DC and RF sputtering deposition, chemical vapor deposition, and plasma assisted chemical vapor deposition. The exact method used depends upon many factors, one of which being deposition temperature constraints imposed by the composition of the target material.

The pair of spacedly disposed contacts 6 and 8 are preferably comprised of the additional thin-film layers 32 and 40 which are deposited remote to the composite memory material 36. Each of these remote thin-film layers is comprised of one or more elements from the group consisting of Ti, W and Mo. In one embodiment, each of the remote thin-film layers is comprised of Ti and W. Preferably, the remote thin-film layers are comprised of a compound, in atomic percent, of 5% to 30% titanium and 70% to 95% tungsten. The Ti—W alloy layers 32 and 40 are preferably deposited using a DC sputtering deposition process. They are preferably deposited to a thickness of about 100 Å to 4000 Å. They are more preferably deposited to a thickness of about 200 Å to 2000 Å. The Ti—W alloy layers 32 and 40 have excellent ohmic contact properties. Moreover, they have the barrier properties necessary to prevent both the electromigration and diffusion of foreign electrode material into the composite memory material 36.

The layer of composite memory material 36 is preferably deposited to a thickness of about 200 Å to 5,000 Å, more preferably of about 250 Å to 2,500 Å, and most preferably of about 250 Å to 500 Å in thickness.

The memory element shown in FIG. 1 may be formed in a multi-step process. Layers 32, 34 and 46 are first deposited and the insulation layer 46 is then etched so that there will be an area of contact between the composite memory material 36 and layer 34. The remaining layers 36, 38 and 40 are deposited and the entire stack of layers 32, 34, 36, 46, 38 and 40 is etched to the selected dimension. Deposited on top of the entire structure is a layer of insulating material 39. Examples of insulating materials are $SiO_2$, $Si_3N_4$ and tellurium oxygen sulfide (e.g., TeOS). The layer of insulating material 39 is etched and a layer of aluminum is deposited to form the second electrode grid structure 42 which extends perpendicular in direction to the conductors 12 and complete the X-Y grid connection to the individual memory elements. Overlaying the complete integrated structure is a top encapsulating layer of a suitable encapsulant such as $Si_3N_4$ or a plastic material such as polyamide, which seals the structure against moisture and other external elements which could cause deterioration and degradation of performance. The $Si_3N_4$ encapsulant can be deposited, for example, using a low temperature plasma deposition process. The polyamide material can be spin coated and baked after deposition in accordance with known techniques to form the encapsulant layer.

The term "pore diameter" as used herein is the average cross-section of the smallest region of contact between the composite memory material 36, and the electrical contacts 6 and 8. The pore diameter can be as small as lithography resolution limits will permit. Pore diameter is related to device performance. Reducing pore diameter reduces device volume, thereby lowering the current and energy requirements needed for electrical switching. This increases the speed and sensitivity of the device—reducing the switching time and electrical energy required to initiate the detectable change in resistance.

In previous embodiments of the memory element it was preferred that the pore diameter be selected to conform substantially with the cross section of the memory material whose resistance is actually altered when the material is switched to either the high or low resistance state. This section of memory material is called the "filamentary portion". Ideally, the pore diameter should equal the diameter of the filamentary portion.

As a means of reducing pore diameter beyond that permitted by lithography, previous embodiments of the memory element have employed "filament confining means" between at least one of the spacedly disposed contacts and the volume of memory material. The filament confining means is, typically, a thin-film layer of highly resistive material with at least one low resistance pathway thereacross through which current passes between the electrical contact and the volume of memory material. The filament confining means provided a high current density within the filamentary portion upon input of a very low electrical current to the spacedly disposed contacts.

The filament confining means plays a role in the "electrical forming process" of the memory device. The electrical forming process consists of applying higher current electrical pulses to the newly constructed memory element until the memory element switches from its originally very high "virgin" resistance value to a lower resistance value. Once this occurs, the memory element is said to be "formed". It is now ready for lower programming current to perform electrical cycling.

The forming process "breaks down" the filament confining means. During one or more of the higher current pulses applied during the forming process, the electrically weakest "breakdown" region in the confining layer is physically changed and becomes much more highly conductive than the remainder of the layer. It is through this region that all of the current of any subsequent memory cycling pulses (i.e. set and reset pulses) will pass. When a very low current is applied to the memory element, all of the current is channeled through the filamentary portion. Hence, because of its extremely small size, the current density is very high within this region of the memory material.

In previous embodiments of the memory element, the programming current required for electrical cycling was decreased by either a lithographic reduction of pore diameter or via the introduction of a filimentary confining means. In contradistinction thereto, in a memory element comprising the composite memory material of the present invention, the desired decrease in programming current is achieved by restricting the volume of phase-change material via the introduction of the inactive dielectric material.

The dielectric material can be made to occupy a selected volume fraction of the new composite material thus reducing the volume fraction occupied by the active phase-change memory material. This reduction of volume fraction of active phase-change memory material decreases the current needed to program the memory element.

Because the volume fraction of dielectric material can be controlled, in thin-film memory applications, the volume of electrically conducting material can be controlled independently of the size of the photolithographically defined contact area. This can allow a reduction in the required programming current at a given scale of photolithography to a value consistent with the current that can be supplied by the memory drivers.

The composite material thus serves a function similar to that of the filament confining means described above. As with the filament confining means, the composite material can define the cross sectional area of the filamentary portion within the memory material during both electrical forming and during switching. Hence, the composite material of the present invention can be used to overcome the lithography limitations of creating a small pore without the need of using an additional layer of material.

Also disclosed herein is an electrically operated, directly overwritable, multibit, single cell memory element comprising a volume of memory material defining a single cell memory element, the memory material constituting means for assuming a large dynamic range of electrical resistance values with the ability to be set directly to one of a plurality of resistance values within the dynamic range without the need to be set to a specific starting or erased resistance value, regardless of the previous resistance value of the material in response to a selected electrical input signal so as to provide the single cell with multibit storage capabilities.

The electrically operated, directly overwritable, multibit, single cell memory element further comprises a pair of spacedly disposed contacts for supplying the electrical input signal to set the memory material to a selected resistance value within the dynamic range. At least one of the spacedly disposed contacts is a mixture of a first and a second contact material. The first contact material includes carbon, and the second contact material includes at least one transition metal element. The term "transition metal" as used herein includes elements 21 to 30, 39 to 48, 57 and 72 to 80. Preferably, the second contact material includes one or more elements selected from the group consisting of Ti, V, Cr, Zr, Nb, Mo, Hf, Ta, W and mixtures or alloys thereof. More preferably, the second contact material includes Ti and W. The contact can be made by a co-sputtering process.

Figure 2:
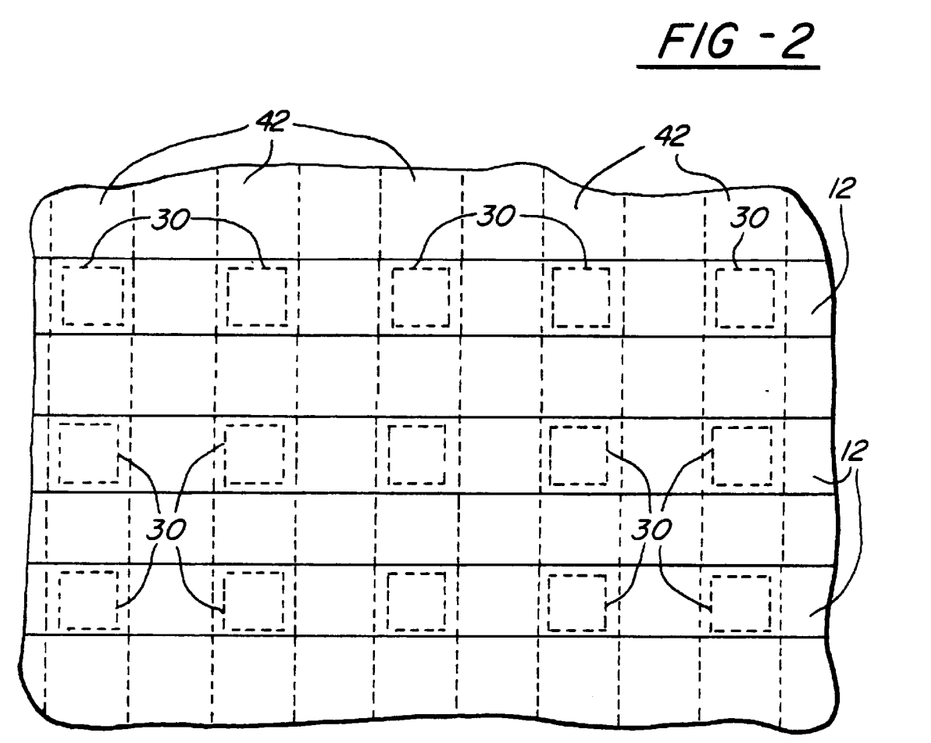
FIG. 2 is the topview of a possible layout of multiple memory elements showing how the elements would be connected to a set of X-Y addressing lines.

The top view of a possible configuration for multiple memory elements is shown in FIG. 2. As shown, the devices form an X-Y matrix of memory elements. The horizontal strips 12 represent the X set of an X-Y electrode grid for addressing the individual elements. The vertical strips 42 represent the Y set of addressing lines.

Other circuit configurations for the electrically erasable memory of the present invention are, of course, possible and feasible to implement. One particularly useful configuration is a three dimensional, multilevel array in which a plurality of planes of memory or control elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection. This arrangement is particularly useful to simulate a neural network for a truly intelligent computer.

Figure 3:
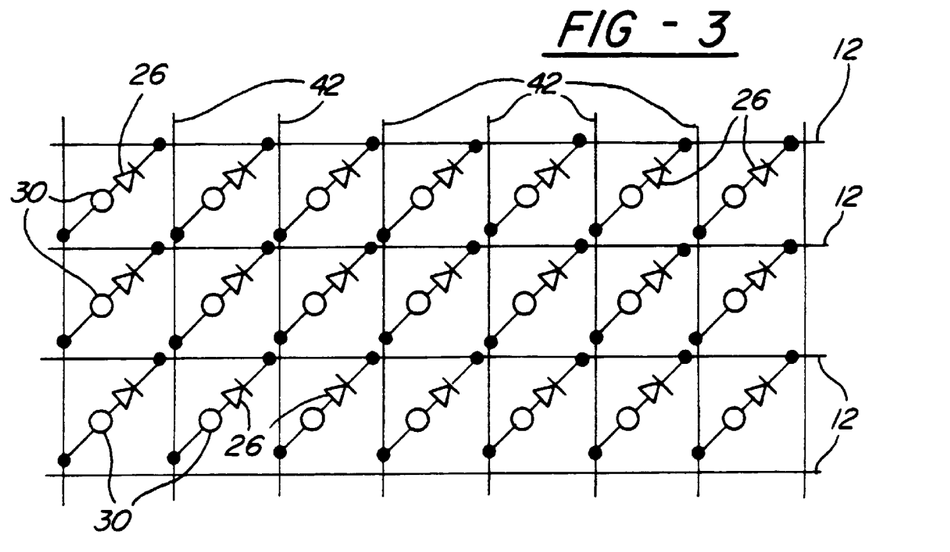
FIG. 3 is a schematic diagram of the memory elements from FIG. 1 showing, in addition, how isolation elements such as diodes are connected in series with the memory elements to electrically isolate each of the devices from the others.

Each memory element is electrically isolated from the others by using some type of isolation element. FIG. 3, a schematic diagram of the memory device layout, shows how electrical isolation can be accomplished using diodes. The circuit comprises an X-Y grid with the memory elements 30 being electrically interconnected in series with isolation diodes 26. Address lines 12 and 42 are connected to external addressing circuitry in a manner well known to those skilled in the art. The purpose of the isolation elements is to enable each discrete memory elements to be read and written without interfering with information stored in adjacent or remote memory elements of the matrix.

Figure 4:
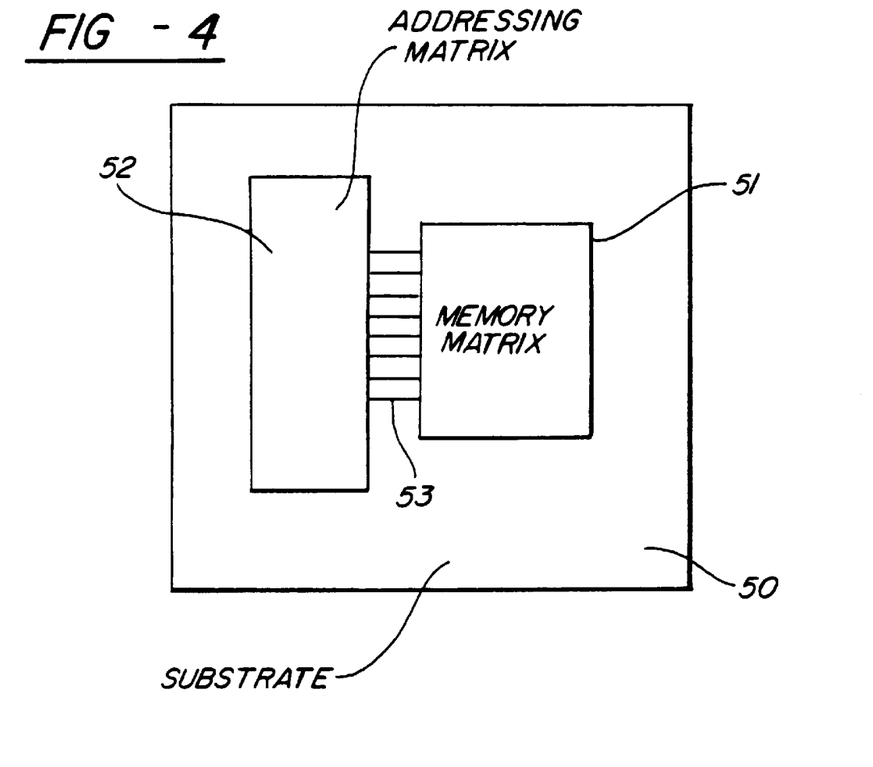
FIG. 4 is a schematic representation illustrating a single crystal semiconductor substrate with the integrated memory matrix of the instant invention as depicted in FIG. 1 placed in electrical communication with an integrated circuit chip on which the address/drivers/decoders are operatively affixed.

FIG. 4 shows a portion of a single crystal semiconductor substrate 50 with a memory matrix 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

Experimentation has shown that factors such as chalcogenide composition, thermal preparation (post deposition anneal), signal pulse duration, impurities such as oxygen present in the composition, crystallite size and signal pulse waveform shape have an effect on the magnitude of the dynamic range of resistances, the absolute end-point resistances of said dynamic range, and the voltages required to set the device at these resistances. For example, relatively thick chalcogenide films (i.e. about 4000 Å) will result in higher set voltage requirements (and therefore higher current densities within the volume of memory material), while relatively thin chalcogenide layers (i.e. about 250 Å) will result in lower set voltage (and current density) requirements. Of course, the possible significance of crystallite size and, therefore, the ratio of the number of surface atoms relative to the number of bulk atoms has previously been described.

The dynamic range of resistances also allows for broad gray scale and multilevel analog memory storage. Multilevel memory storage is accomplished by dividing the broad dynamic range into a plurality of sub-ranges or levels. The continuous resistance programmability allows for multiple bits of binary information to be stored in a single memory cell. This multilevel storage is accomplished by mimicking multiple bits of binary information in pseudo-analog form and storing this analog information in a single memory cell. Thus, by dividing the dynamic range of resistances into $2^n$ analog levels, each memory cell would be provided with the capability of storing n bits of binary information.

Through the use of the proprietary materials and device configurations disclosed herein, an electrically erasable, directly overwritable memory element has been developed which provides fast read and write speeds, approaching those of SRAM devices; non-volatility and random access reprogramming capabilities of an EEPROM; and a price per megabyte of storage significantly below any other semiconductor memory.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically operated, directly overwritable single-cell memory element comprising:

a volume of memory material defining a single-cell memory element comprising a heterogeneous mixture of active phase-change material and inactive dielectric material; and a pair of spacedly disposed contacts for supplying an electrical signal to said volume of memory material, said contacts providing terminals for reading information stored in and writing information to said memory element.

2. The memory element of claim 1, wherein said phase-change memory material includes one or more elements selected from the group consisting of Te, Se, Ge, Sb, Bi, Pb, Sn, As, S, Si, P, O and mixtures or alloys thereof.

3. The memory element of claim 2, wherein said phase-change memory material includes at least one chalcogen element and at least one transition metal element.

4. The memory element of claim 3, wherein said chalcogen element is selected from the group of Te, Se and mixtures or alloys thereof.

5. The memory element of claim 4, wherein said chalcogen element is a mixture of both Te and Se.

6. The memory element of claim 3, wherein said at least one transition metal element is selected from the group consisting of Cr, Fe, Ni, Nb, Pd, Pt and mixtures or alloys thereof.

7. The memory element of claim 1, wherein said dielectric material is one or more materials selected from the group consisting of oxides, nitrides, fluorides, sulfides, chlorides, carbides, oxynitrides, carboxynitrides, borides, phosphides and mixtures or alloys thereof.

8. The memory element of claim 1, wherein said dielectric material is an organic dielectric material.

9. The memory element of claim 1, wherein the percentage by volume of said dielectric material is between about 10% and about 90%.

10. The memory element of claim 9, wherein the percentage by volume of said dielectric material is between about 20% and about 80%.

11. The memory element of claim 10, wherein the percentage by volume of said dielectric material is between about 40% and about 60%.

12. An electrically operated, directly overwritable, multibit, single cell memory element comprising:

a volume of memory material defining a single cell memory element, said memory material constituting means for assuming a large dynamic range of electrical resistance values with the ability to be set directly to one of a plurality of resistance values within said dynamic range without the need to be set to a specific starting or erased resistance value, regardless of the previous resistance value of said material in response to a selected electrical input signal so as to provide said single cell with multibit storage capabilities; and a pair of spacedly disposed contacts for supplying said electrical input signal to set said memory material to a selected resistance value within said dynamic range, wherein at least one of said spacedly disposed contacts is a mixture of a first contact material and a second contact material, wherein said first contact material includes carbon, and wherein said second contact material includes at least one transition metal element.

13. The memory element of claim 12, wherein said second contact material includes one or more elements selected from the group consisting of Ti, V, Cr, Zr, Nb, Mo, Hf, Ta, W and mixtures or alloys thereof.

14. The memory element of claim 13, wherein said second contact material includes Ti and W.

* * * * *